United States Patent [19]

Hashimoto et al.

[11] Patent Number: 5,015,352

[45] Date of Patent: May 14, 1991

[54] PREPARATION METHOD FOR AMORPHOUS SUPERLATTICE ALLOYS

[75] Inventors: Koji Hashimoto, 2-25-2, Shogen, Izumi-ku, Sendai-shi, Miyagi; Hideaki Yoshioka, Sendai; Katsuhiko Asami, Sendai; Asahi Kawashima, Sendai, all of Japan

[73] Assignees: Yoshida Kogyo K. K.; Koji Hashimoto, both of Japan; a part interest

[21] Appl. No.: 420,903

[22] Filed: Oct. 13, 1989

[30] Foreign Application Priority Data

Oct. 15, 1988 [JP] Japan .................................. 63-260021

[51] Int. Cl.$^5$ ............................................. C23C 14/34
[52] U.S. Cl. .......................... 204/192.15; 204/192.12; 204/192.16; 204/298.27
[58] Field of Search ...................... 204/192.12, 192.15, 204/192.16, 298.27, 298.28

[56] References Cited

FOREIGN PATENT DOCUMENTS 59-74648  4/1984  Japan .............................. 204/298.27
63-79951  4/1988  Japan .............................. 204/192.12

Primary Examiner—Aaron Weisstuch
Attorney, Agent, or Firm—Hill, Van Santen, Steadman & Simpson

[57] ABSTRACT

A method for preparation of amorphous superlattice alloys consisting of lamellae based on periodic change in the composition by continuous conventional sputtering with a periodic change in the positions of substrates relative to a target or targets by rotating the substrate on a first axis and orbiting the substrate and first axis around a second axis parallel to the first axis.

2 Claims, 2 Drawing Sheets

PREPARATION METHOD FOR AMORPHOUS SUPERLATTICE ALLOYS

BACKGROUND OF THE INVENTION

1. Field of the Invention

The present invention relates to a preparation method for amorphous superlattice alloys applicable to a variety of fields such as materials with specific magnetic and chemical properties.

2. Description of the Prior Art

The formation of atomic lamellar structures in which each layer consists of different pure elements is known, and the method for preparation of amorphous alloys by sputtering is also known. However, a method of forming an amorphous superlattice based on the repetition of two amorphous layers of different compositions is not known.

The method of forming a superlattice by alternating sputtering of two kinds of metals or alloys is well known. Instead of alternating sputtering of two kinds of metals or alloys, preparation of the amorphous superlattice alloys by continuous conventional sputtering has not been performed. However, there has been a strong demand development of a new method to form new superlattice alloys, that is, preparation of the amorphous superlattice alloys by continuous conventional sputtering.

SUMMARY OF THE INVENTION

It is an objective of the present invention to provide a continuous method for production of an amorphous superlattice alloy consisting of lamellae based on periodic change in the composition by sputtering.

The objective of the invention is achieved by the present invention:

(1) A method of preparation, by sputtering, of an amorphous superlattice alloy consisting of lamellae based on periodic change in the composition characterized by periodic change in the positions of substrates relative to a target due to revolution of the substrates which rotate about a first or central axis, facing the target in a plane parallel in a plane parallel to the target face about a parallel second axis different from the central axis normal to the center of the face of the target, consisting of metal or alloy pieces placed on or embedded in the erosion region of another metal or alloy disc.

(2) A method of preparation, by sputtering, of an amorphous superlattice alloy consisting of lamellae based on periodic change in the composition; characterized by periodic change in the positions of substrates relative to multiple targets, due to revolution of the substrates, which rotate about, axis different from the point of intersection of vertical lines normal to the surfaces of the multiple targets consisting of metal or alloy pieces placed on or embedded in the erosion region of another metal or alloy discs installed obliquely in a sputtering machine.

DETAILED DESCRIPTION OF THE PREFERRED EMBODIMENTS

The present invention aims to provide a continuous method for production of an amorphous superlattice alloy consisting of lamellae based on a periodic change in the composition by sputtering.

It is generally known that an alloy has a crystalline structure in the solid state. However, an alloy having a specific composition becomes amorphous by prevention of the formation of a long-range order structure during solidification through, for example, rapid solidification from the liquid state, sputter deposition or plating under specific conditions; or by destruction of the long-range order structure of the solid alloy through ion implantation which is also effective for supersaturation with necessary elements. The amorphous alloy thus formed is a homogeneous single phase supersaturated solid solution containing sufficient amounts of various alloying elements beneficial in providing specific characteristics, such as high corrosion resistance, high mechanical strength and high toughness.

The present inventors carried out a series of researches paying attention to the preparation methods and outstanding properties of amorphous alloys. They found that amorphous alloys consisting of metals having high melting points and metals having low melting points can be prepared by a sputter deposition method which does not require mixing of metallic elements by melting. Furthermore, the present inventors found that an amorphous superlattice alloy consisting of lamellae based on a periodic change in the composition can be prepared by periodically changing the substrate position relative to the target for sputtering. The method of the present invention has been accomplished on the basis of this finding.

Sputtering is generally performed by using a sintered or alloyed crystalline target of multiple phases whose average composition is the same as the amorphous alloy to be prepared. Sputtering is also carried out by using, a target consisting of a metal sheet of one of the constituents in the amorphous alloy to be prepared and other metal constituents placed on the metal sheet.

Figure 1:
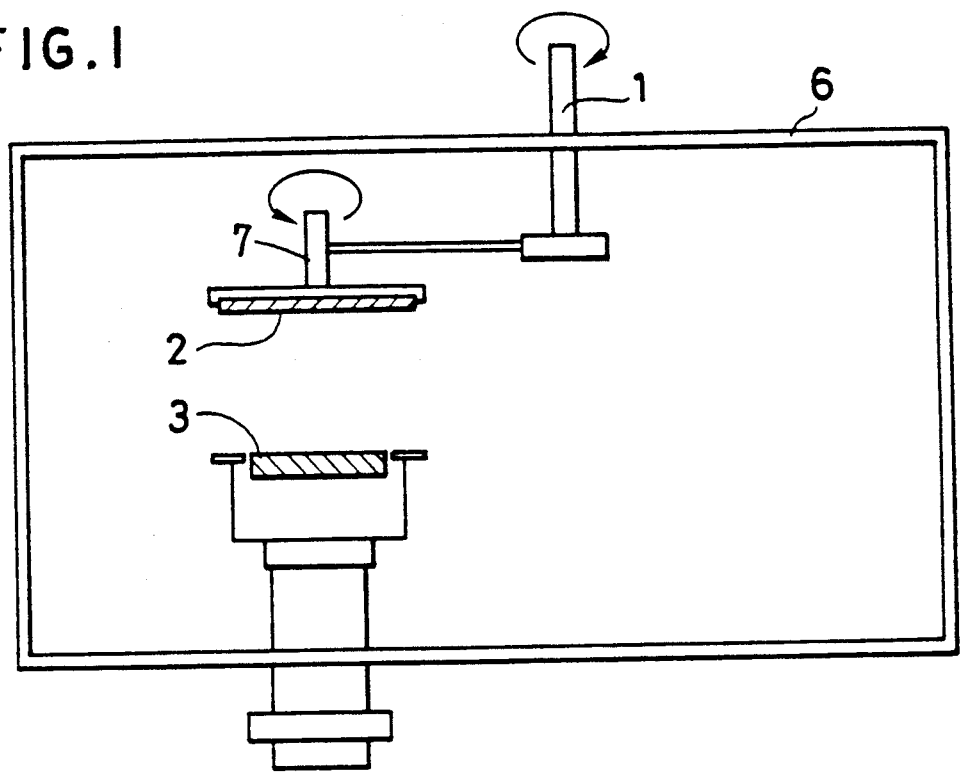
FIGS. 1 and 2 show examples of apparatuses for preparing an amorphous superlattice alloy of the present invention.
Figure 3:
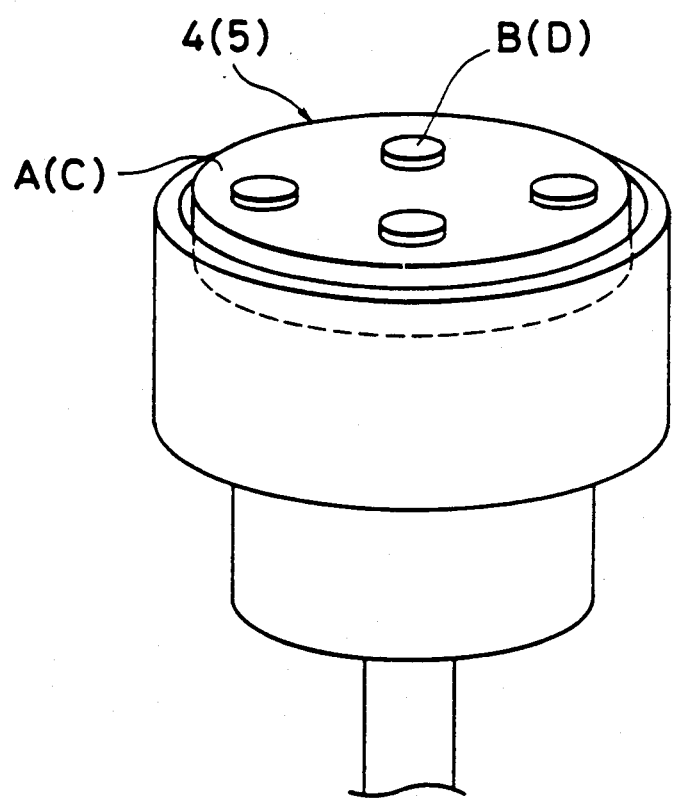
FIG. 3 shows an example of a target assembly.

The present invention was performed by improvements of these methods as follows:

As shown in FIG. 3, targets 4 (or 5) consist of metal or alloy pieces B (or D) placed on or embedded in the erosion region of another metal or alloy disc A (or C). An example of the apparatus is shown in FIG. 1. The positions of by rotating the substrate on a first axis and orbiting the substrate and first axis around a second axis parallel to the first axis rotated on a first axis 7, which is parallel to a second or central axis 1, relative to a target 3 are periodically changed by orbiting of the substrates 2 around the second axis 1 different from the normal of the center of the target 3 in a sputtering chamber 6. Sputtering by this procedure enables the formation of an amorphous alloy consisting of A (or C) and B (or D) in which the concentrations of A (or C) and B (or D) change periodically.

Figure 2:
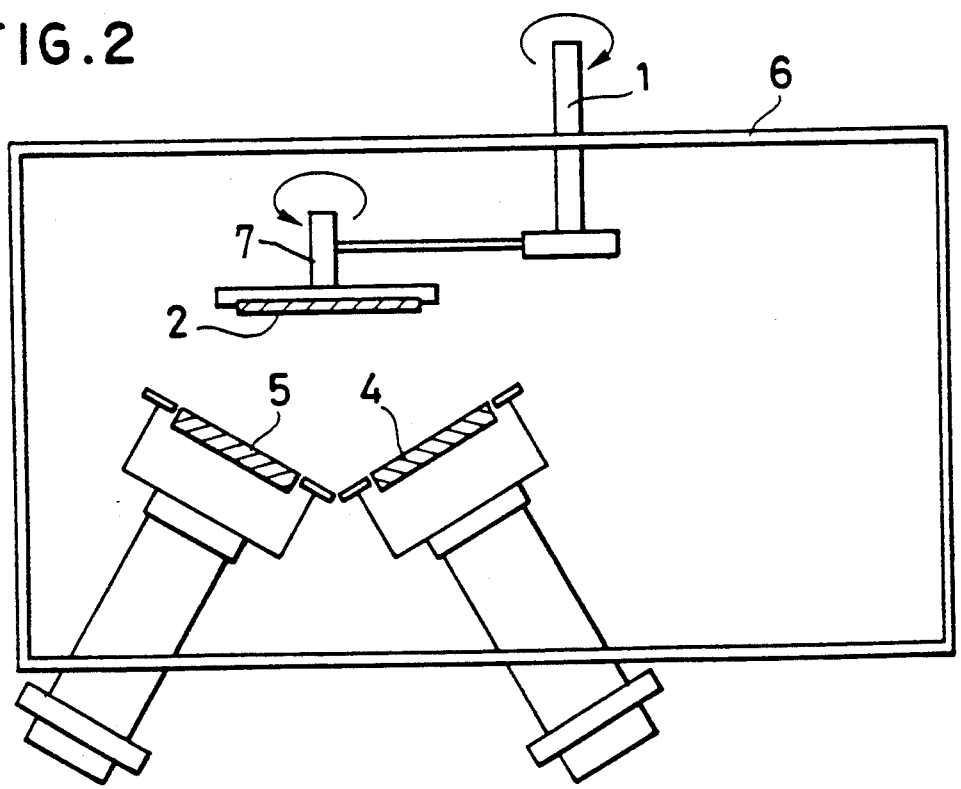

The apparatus shown in FIG. 2 can also be used. For instance a target 4 consists of metals or alloys A and B which constitutes the amorphous alloy, and another target 5 consists of metals or alloys C and D which also constitute the amorphous alloy. These two targets 4 and 5 are installed obliquely in the sputtering chamber 6, in such a way that the intersection of the normals to the centers of these two targets is on the orbit of the center or axis 7 of the substrates 2 revolving around a central axis 1 of the sputtering chamber 6. The positions of the substrates 2 relative to the intersection of the normals to the centers of these two targets 4 and 5 are periodically changed by the rotation and orbiting of the substrates 2. Sputtering by this procedure enables the formation of an amorphous alloy consisting of A, B, C and D in which the concentrations of A, B, C and D change periodically. The average composition of the amorphous alloy can easily be changed by changing, for instance, the area of B placed on A.

The invention is not illustrated by the following examples:

EXAMPLE 1

The targets consisted of 4 Ta discs of 20 mm diameter and 1 mm thickness placed symmetrically on an Al disc of 100 mm diameter and 6 mm thickness so as to place the center of Ta discs on a concentric circle of 58 mm diameter on the surface of the Al disc. The sputtering apparatus shown in FIG. 1 was used. Substrates were an Al disc and two glasses which were rotated or orbited with the rate of 6.26 sec/revolution around the central axis of the sputtering chamber. Sputtering was carried out at the power of 240-200 watts under purified Ar stream of 5 ml/min at a vacuum of $2 \times 10^{-3}$ Torr.

X-ray diffraction of the sputter deposit thus prepared revealed the formation of an amorphous alloy. Electron probe microanalysis showed that the amorphous alloys consisted of Al-22 at% Ta alloy.

After slicing the alloy by a ultra-microtome, the cross section of the alloy was observed by a transmission electron microscope. The electron microscopy revealed that the alloy is an amorphous superlattice alloy consisting of the repetition of 3 nm thick lamellae.

EXAMPLE 2

As shown in Table 1, targets used were composed of different numbers of various discs placed on the same Al disc as described in Example 1. Sputtering was carried out similarly to Example 1. X-ray diffraction of the sputter deposits thus prepared revealed the formation of amorphous alloys. The number of the discs placed on the Al disc, the cycle of revolution of the substrates, the average composition of the amorphous superlattice alloy formed and the thickness of each lamella are shown in Table 1.

TABLE 1

Composition and Periodicity of Amorphous Superlattice Alloys

| Metal disc on Al | No. of discs on Al | Revolution cycle of substrate (Sec/rev.) | Average composition of amorphous alloy (at %) | Thickness of lamella (nm) |
|---|---|---|---|---|
| Ta | 4 | 12.5 | 22 | 5.8 |
| Ta | 4 | 25.0 | 22 | 10.6 |
| Ta | 6 | 12.5 | 38 | 4.1 |
| Mo | 3 | 12.5 | 19 | 7.2 |
| Mo | 6 | 12.5 | 49 | 5.5 |
| Nb | 4 | 6.26 | 20 | 3.2 |
| Nb | 4 | 12.5 | 20 | 6.1 |
| Nb | 4 | 25.0 | 20 | 11.3 |
| Nb | 7 | 12.5 | 58 | 4.5 |
| W | 4 | 12.5 | 15 | 6.5 |
| W | 6 | 12.5 | 45 | 5.1 |

In these two examples, the apparatus shown in FIG. 1 was used. Similar amorphous superlattice alloys are also produced by using the apparatus shown in FIG. 2.

What is claimed is:

1. A method of preparation by sputtering of an amorphous superlattice alloy consisting of lamellae based on periodic changes in the composition, said method comprising the steps of providing a target consisting of metal or alloy pieces placed on or embedded in an erosion region of another metal or alloy disk, continuously sputtering the erosion region onto substrates, and periodically changing the position of the substrate relative to the target by rotating the substrate in a plane extending parallel to a target face around a first axis extending normal to a center of the face of the target and orbiting the target around a second axis parallel to the first axis and spaced therefrom.

2. A method of preparation by sputtering of an amorphous superlattice alloy consisting of a lamellae based on a periodic change in the composition, said method comprising the steps of providing multiple targets, each consisting of metal or metal alloy pieces placed on or embedded in erosion regions of another metal or alloy disk, said targets being provided to extend obliquely to one another in a sputtering apparatus, continuously sputtering the erosion region onto the substrate and periodically changing the position of the substrate relative to the multiple targets by rotating the target on a first axis lying on a line of intersection of a normal of each of said targets and also orbiting the target around a second axis extending parallel to the first axis.

* * * * *